(12) United States Patent
Shen

(10) Patent No.: US 9,978,640 B2
(45) Date of Patent: May 22, 2018

(54) METHOD OF FABRICATING A SEMICONDUCTOR DEVICE WITH REDUCED LEAK PATHS

(71) Applicant: Taiwan Semiconductor Manufacturing Company Limited, Hsinchu (TW)

(72) Inventor: Guan-Jie Shen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 122 days.

(21) Appl. No.: 15/088,241

(22) Filed: Apr. 1, 2016

(65) Prior Publication Data

US 2016/0218036 A1    Jul. 28, 2016

Related U.S. Application Data

(62) Division of application No. 14/279,667, filed on May 16, 2014, now Pat. No. 9,330,967.

(51) Int. Cl.
  *H01L 21/768* (2006.01)
  *H01L 23/522* (2006.01)
  *H01L 23/532* (2006.01)

(52) U.S. Cl.
  CPC .. *H01L 21/76888* (2013.01); *H01L 21/76805* (2013.01); *H01L 21/76814* (2013.01); *H01L 21/76826* (2013.01); *H01L 21/76895* (2013.01); *H01L 23/5226* (2013.01); *H01L 21/76877* (2013.01); *H01L 23/5223* (2013.01); *H01L 23/53295* (2013.01); *H01L 2924/0002* (2013.01)

(58) Field of Classification Search
  CPC ............... H01L 23/5226; H01L 23/522; H01L 29/66545
  See application file for complete search history.

(56) References Cited

U.S. PATENT DOCUMENTS 6,727,560 B1 * 4/2004 Pan .................... H01L 21/28088
                                                   257/388
7,855,457 B2   12/2010 Mizukami et al.
2015/0102419 A1  4/2015 Ikeda et al.

FOREIGN PATENT DOCUMENTS

KR       1020100011799    *  2/2010  ............. H01L 21/28

* cited by examiner

*Primary Examiner* — Yu-Hsi D Sun
(74) *Attorney, Agent, or Firm* — Jones Day

(57) ABSTRACT

A method of manufacturing a semiconductor device includes fabricating a transistor, surrounding a gate of the transistor with a spacer, and applying an oxidation operation to a conductive item, e.g., a residue from the fabrication of the gate of the transistor, that extends through the spacer. As such, the occurrence of leak paths in the semiconductor device is reduced.

20 Claims, 4 Drawing Sheets

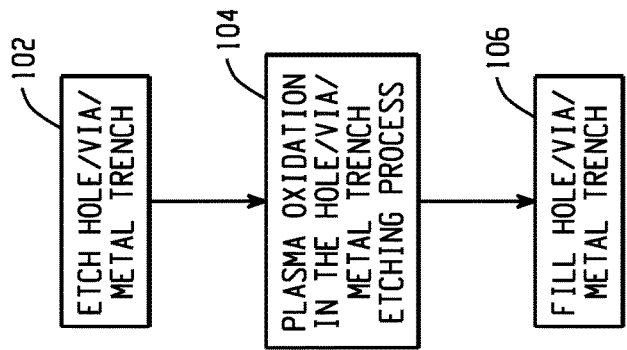
Fig. 3
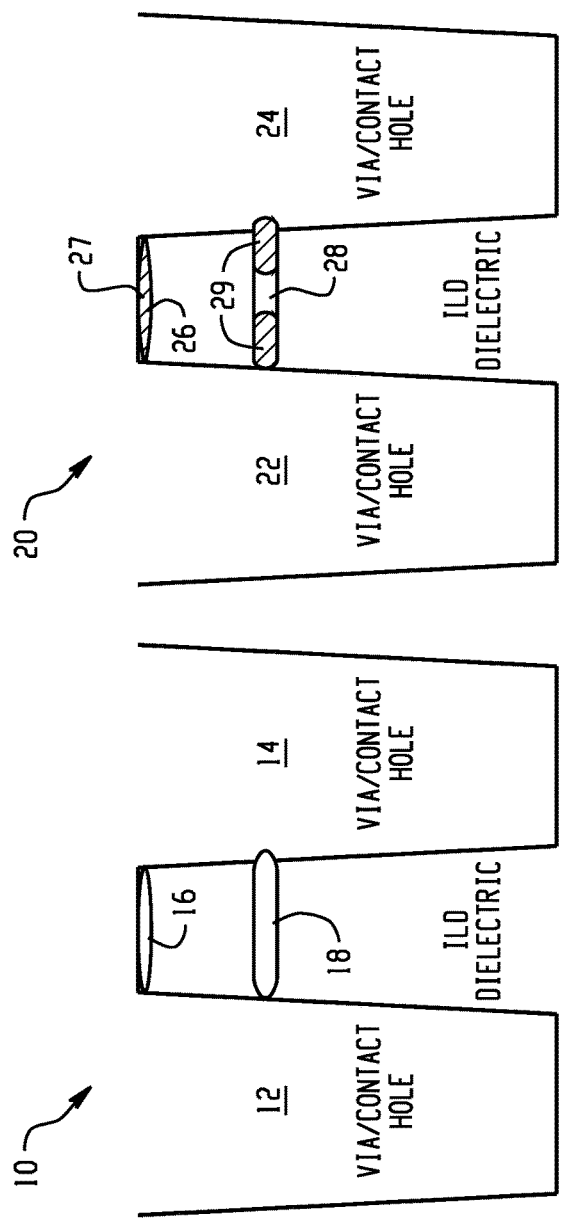
Fig. 2
Fig. 1

METHOD OF FABRICATING A SEMICONDUCTOR DEVICE WITH REDUCED LEAK PATHS

CROSS-REFERENCE TO RELATED APPLICATION

This application is a divisional of U.S. patent application Ser. No. 14/279,667, filed May 16, 2014, which is incorporated herein by reference in its entirety.

BACKGROUND

The technology described in this patent document relates to MOSFET devices, and more specifically to reducing leak paths in MOSFET devices.

Scaling of semiconductor devices, such as a metal-oxide semiconductor field-effect transistor (MOSFET), has enabled continued improvement in speed, performance, density, and cost per unit function of integrated circuits over the past few decades. Reducing leak paths in MOSFET devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram depicting a cross sectional view of a portion of an example semiconductor device.

FIG. 2 is a diagram depicting a cross sectional view of a portion of another example semiconductor device, in accordance with some embodiments.

FIG. 3 is a process flow chart depicting an example process for applying a non-conductive surface layer to unintended conductive items, in accordance with some embodiments.

DETAILED DESCRIPTION

Figure 4:
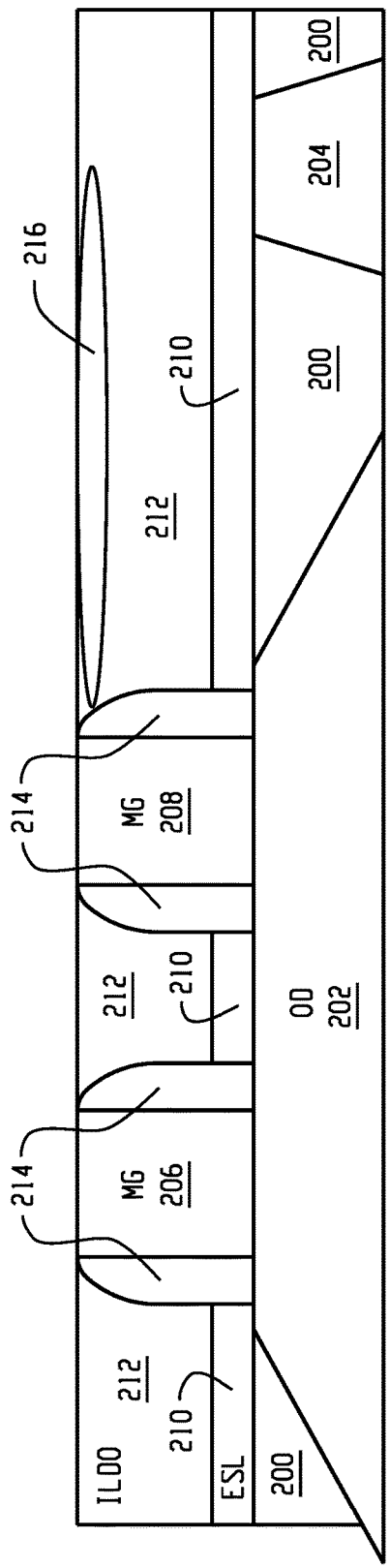
FIGS. 4-7 depict cross-sectional views of an example semiconductor device during different stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, the pattern pitch is getting narrower and process window margins such as the over-etch window is constrained. Meanwhile, the leak tolerance is often very tight. Process metal residue, conductive byproducts, or in-film conductive impurities may lead to a leak path resulting in electrical failure. The following examples provide methods to reduce the occurrence of a leak path.

FIG. 1 is a diagram depicting a cross sectional view of a portion of a semiconductor device 10. Illustrated are two voids 12, 14 that may be etched or otherwise formed in non-conductive portions of the semiconductor device 10 that may, for example, serve as a hole for a via or metal contact that provides a conduction path between material that is otherwise isolated. Also shown are two unintended conductive items 16, 18 that exist in the semiconductor device. These unintended conductive items 16, 18 may, for example, be conductive structures such as metal residue, a conductive by-product, an in-film conductive impurity, or some other unintended conductive item. Because of their particular placement in this example, the unintended conductive items may provide a leak path between the two voids after the voids are filled with metallic or other conductive material.

FIG. 2 is a diagram depicting a cross sectional view of a portion of a semiconductor device 20. Illustrated are two voids 22, 24 that may be formed in the semiconductor device 20 that may, for example, serve as a trench or a hole for a via or metal contact that provides a conduction path between material that is otherwise isolated. Also shown are two unintended conductive items 26, 28 that exist in the semiconductor device. These unintended conductive items 26, 28 may, for example, be conductive structures such as a metal or other conductive residue, a conductive by-product, an in-film conductive impurity, or some other unintended conductive item. These unintended conductive items 26, 28 have had a non-conductive surface layer material, such as a non-conductive oxide surface layer, formed on their surfaces to prevent these conductive items 26, 28 from providing a conduction path, i.e., a leak path, between the two voids 22, 24 after the voids are filled with metallic or other conductive material. The application of a non-conductive surface layer material to the unintended conductive items may reduce the occurrences of a leak path between conductive elements in the semiconductor device such as metal gates, vias, contacts, metal trenches, etc.

FIG. 3 is a process flow chart depicting an example process for applying a non-conductive surface layer to unintended conductive items near voids such as holes and trenches. In this example, a trench or a hole for a via or metal contact is formed through operations such as etching operations (operation 102). Prior to filling the trench or hole with conductive material, non-conductive surface layer application operations such as oxidation operations and more particularly plasma oxidation operations may be applied a surface surrounding the hole opening and to side walls of the hole or trench (operation 104). The application of plasma oxidation operations to a surface surrounding the hole or trench opening may cause a non-conductive oxide surface layer to be formed on an unintended conductive item located adjacent to the trench or hole opening, such as the non-conductive oxide surface layer formed on the unintended conductive item 26 of FIG. 2. The application of plasma oxidation operations to side walls of the hole or trench may cause a non-conductive oxide surface layer to be formed on an unintended conductive item located adjacent to sidewalls of the trench or hole, such as the non-conductive oxide surface layer formed on the unintended conductive item 28 of FIG. 2. After non-conductive surface layer application operations are performed, the hole or trench may be filled with conductive material such as metal material (operation 106).

FIGS. 4-7 depict cross-sectional views of an example semiconductor device during different stages of fabrication. Depicted in FIG. 4 is a semiconductor device having an substrate 200, a first oxidation diffusion (OD) region 202, a second OD region 204, a metal gate 206 of a first transistor, a metal gate 208 of a second transistor, an etch stop layer (ESL 210), an interlayer dielectric layer (ILD0 212), spacers 214 surrounding the metal gates 206, 208, and an unintended conductive item 216. The unintended conductive item 216, in this example, comprises metal gate (MG) residue or MG metallic extrusion resulting from metal gate chemical mechanical polishing (CMP) operations.

Figure 5:
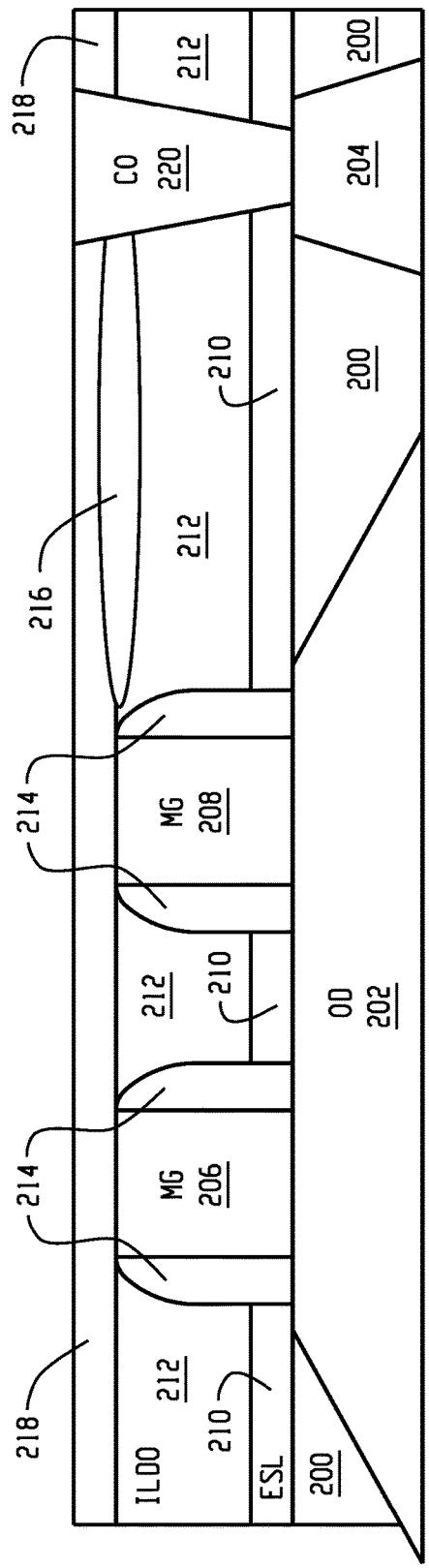

Depicted in FIG. 5, is the example semiconductor device after a second ESL 218 has been deposited and a contact hole 220 has been etched. In this example, the unintended conductive item 216 forms a conductive bridge between the contact hole 220 and the metal gate 208.

Figure 6:
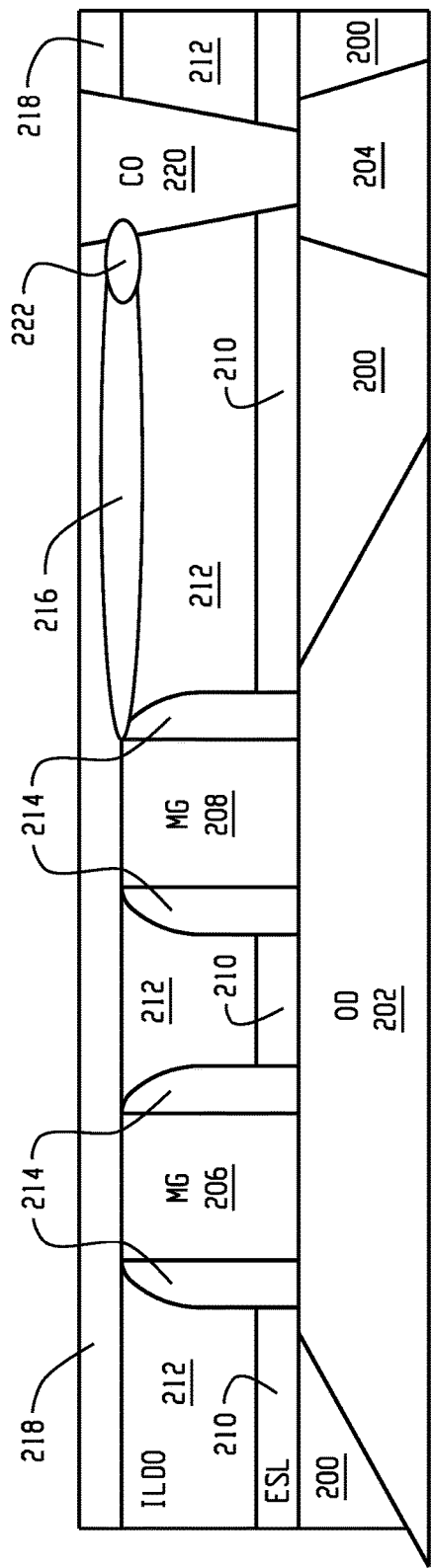

Depicted in FIG. 6, is the example semiconductor device after plasma oxidation operations have been performed on side walls of the contact hole 220. In this example, a surface area 222 of the unintended conductive item 216 has been oxidized by the plasma oxidation operations to form an insulator to prevent a conductive bridge between the contact hole 220 and the metal gate 208.

Figure 7:
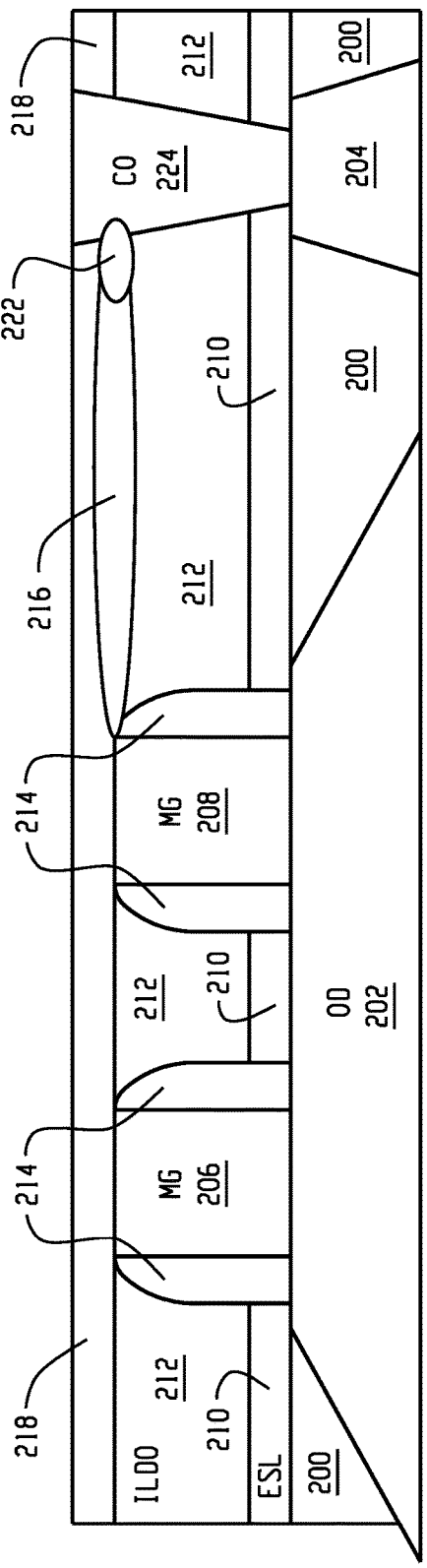

Depicted in FIG. 7, is the example semiconductor device after metal gap filling of the contact hole 220. In this example, the surface area 222 of the unintended conductive item 216 has blocked the formation of a conductive bridge between the metal 224 in the contact hole 220 and the metal gate 208.

Figure 8:
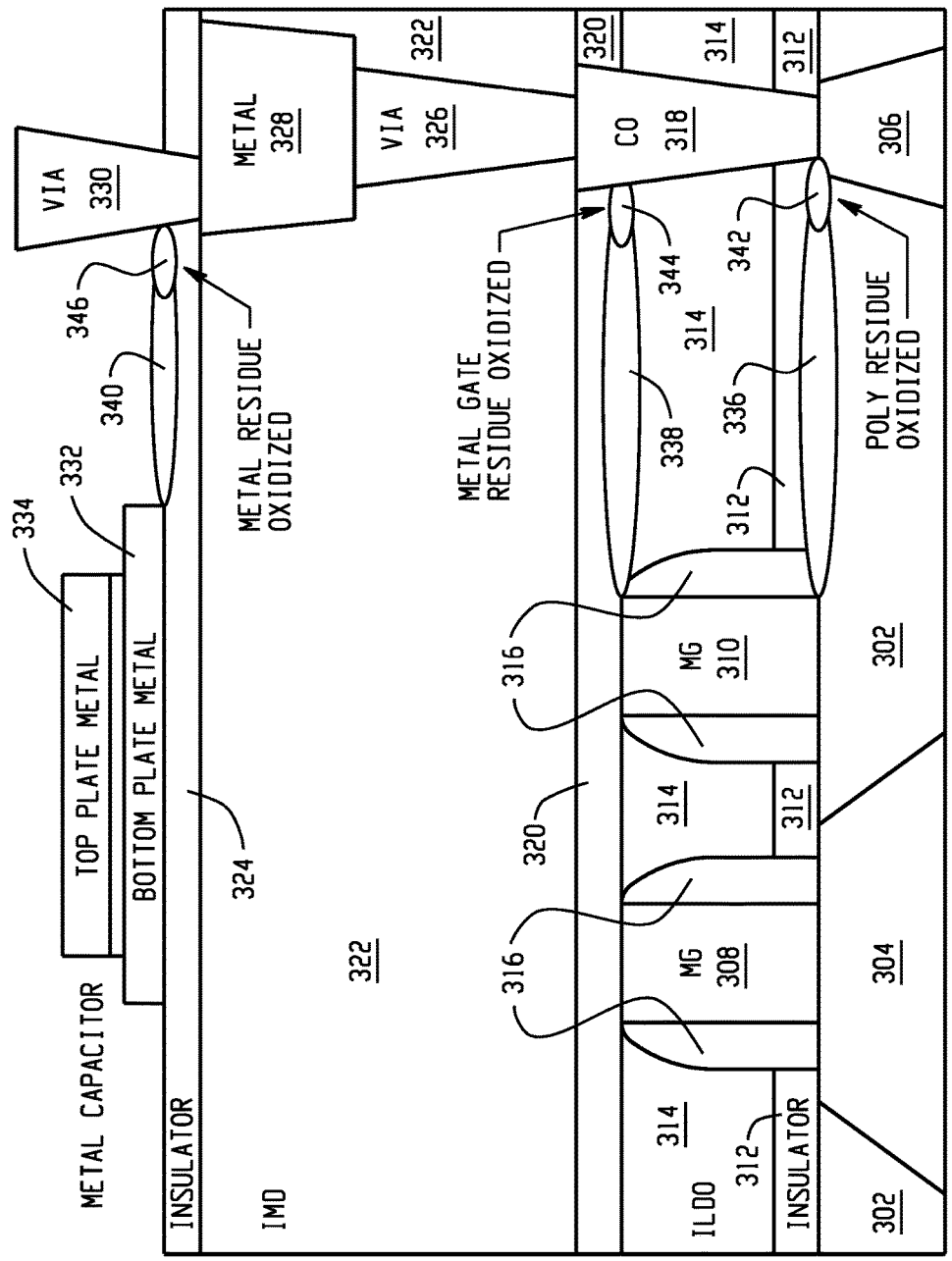
FIG. 8 depicts a cross-sectional view of another example semiconductor device, in accordance with some embodiments.

FIG. 8 depicts a cross-sectional view of another example semiconductor device. Depicted in FIG. 4 is a semiconductor device 300 having a substrate 302, a first OD region 304, a second OD region 306, a metal gate 308 of a first transistor, a metal gate 310 of a second transistor, a first insulator layer 312, an ILD0 314, spacers 316 surrounding the metal gates 308, 310, a contact 318, a second insulator layer 320, an intermediate dielectric layer 322, a third insulator layer 324, a first via 326, a metal contact 328, a second via 330, and a metal capacitor having a bottom metal plate 332 and a top metal plate 334.

The example semiconductor device 300 also has three unintended conductive items: poly residue 336 (e.g., residue from dummy poly gate removal), metal gate residue 338 (e.g., residue from metal gate etching operations), and metal residue 340 (e.g., residue from metal plate formation). The example semiconductor device 300 has non-conductive surface layer oxide applied to each of the three unintended conductive items. The poly residue 336 has an oxidized surface area 342 to prevent bridging between the contact 318 and the metal gate 310 through the poly residue 336. The metal gate residue 338 has an oxidized surface area 344 to prevent bridging between the contact 318 and the metal gate 310 through the metal gate residue 338. The metal residue 340 has an oxidized surface area 346 to prevent bridging between the via 330 and the metal plate 332 through the metal residue 340.

The preceding examples illustrate that in a semiconductor fabrication process the surface surrounding a void and side walls within the void may be oxidized, for example, by plasma oxidation in a last step in the void etching process. The surface oxide formed on an unintended conductive item by the oxidation operation may effectively block a potential leak path between conductive items that are intended to be isolated from each other.

In one embodiment, disclosed is a method of manufacturing a semiconductor device. The method comprises fabricating a transistor, surrounding a gate of the transistor with a spacer, and applying an oxidation operation to a conductive item that extends through the spacer.

In another embodiment, a method of manufacturing a semiconductor device is disclosed. The method comprises fabricating an electronic component and applying an oxidation operation to a conductive residue from the fabrication of the electronic component.

In another embodiment, a method of manufacturing a semiconductor device is disclosed. The method comprises forming a pair of insulator layers, forming a hole that extends through a junction of the insulator layers, and applying an oxidation operation to a sidewall that defines the hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    fabricating a transistor comprising a gate;
    fabricating a spacer adjacent to the gate;
    disposing a material over the gate and the spacer; and
    applying an oxidation operation to a conductive item that extends beneath the material and through the spacer.

2. The method of claim 1, wherein fabricating the transistor results in the conductive item.

3. The method of claim 1, further comprising:
    forming an insulator layer; and
    forming a hole in the insulator layer, wherein applying the oxidation operation includes applying the oxidation operation to a sidewall that defines the hole.

4. The method of claim 3, further comprising filling the hole with a conductive material.

5. The method of claim 3, further comprising:
    disposing the conductive item within the insulator layer such that a first end of the conductive item extends from the insulator layer through the spacer;
    forming an insulator layer;
    forming a hole in the insulator layer such that a second end of the conductive item is adjacent to a sidewall that defines the hole, wherein the step of applying an oxidation operation includes applying the oxidation operation to the second end of the conductive item.

6. The method of claim 1, further comprising:
fabricating a passive electronic component that results in a second conductive item; and
applying a second oxidation operation to the second conductive item.

7. The method of claim 6, further comprising:
forming an insulator layer; and
forming a hole in the insulator layer, wherein applying the second oxidation operation includes applying the second oxidation operation to a sidewall that defines the hole.

8. The method of claim 7, further comprising filling the hole with a conductive material.

9. A method of manufacturing a semiconductor device, comprising:
fabricating an electronic component;
forming a conductive residue in contact with the electronic component;
disposing a material over the electronic component and the conductive residue; and
applying an oxidation operation to the conductive residue beneath the material.

10. The method of claim 9, wherein fabricating the electronic component includes fabricating an active electronic component or a passive electronic component.

11. The method of claim 9, wherein fabricating the electronic component also forms the conductive residue on a portion of a dielectric layer.

12. The method of claim 9, wherein fabricating the electronic component is such that the conductive residue extends from the electronic component.

13. The method of claim 9, further comprising:
forming an insulator layer; and
forming a hole in the insulator layer such that a portion of the conductive residue defines a portion of a sidewall that defines the hole, wherein applying the oxidation operation includes applying the oxidation operation to the sidewall that defines the hole.

14. The method of claim 13, further comprising filling the hole with a conductive material.

15. A method of manufacturing a semiconductor device, comprising:
fabricating an electronic component;
performing a chemical mechanical polishing (CMP) operation on the electronic component;
disposing a material over the electronic component; and
applying an oxidation operation to a conductive residue that results from the CMP and is disposed beneath the material.

16. The method of claim 15, wherein fabricating the electronic component includes fabricating an active electronic component.

17. The method of claim 16, wherein fabricating the active electronic component includes fabricating a transistor.

18. The method of claim 15, further comprising:
forming an insulator layer; and
forming a contact hole in the insulator layer such that the conductive residue forms a conductive bridge between the contact hole and the electronic component.

19. The method of claim 18, wherein applying the oxidation operation includes applying the oxidation operation to a sidewall that defines the contact hole.

20. The method of claim 18, further comprising filling the contact hole with a conductive material.

* * * * *